United States Patent
Kim et al.

(10) Patent No.: US 8,886,063 B2
(45) Date of Patent: Nov. 11, 2014

(54) IMAGE FORMING APPARATUS AND METHOD OF CONTROLLING DEVELOPING UNIT THEREOF

(71) Applicants: Byung-kyu Kim, Bucheon-si (KR); Hae-chul Han, Suwon-si (KR); Shinichi Hisatomi, Suwon-si (KR)

(72) Inventors: Byung-kyu Kim, Bucheon-si (KR); Hae-chul Han, Suwon-si (KR); Shinichi Hisatomi, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 13/673,322

(22) Filed: Nov. 9, 2012

(65) Prior Publication Data
US 2013/0308961 A1    Nov. 21, 2013

(30) Foreign Application Priority Data
May 21, 2012   (KR) .................. 10-2012-0053788

(51) Int. Cl.
  *G03G 15/08*   (2006.01)
  *G03G 15/09*   (2006.01)
  *G01R 35/00*   (2006.01)

(52) U.S. Cl.
  CPC ................... *G01R 35/005* (2013.01); *G03G 15/086* (2013.01)
  USPC .............. 399/30; 399/43; 399/44; 399/59; 399/62

(58) Field of Classification Search
  USPC .............. 399/30, 43, 44, 58, 59, 61, 62, 63
  See application file for complete search history.

(56) References Cited

U.S. PATENT DOCUMENTS

| | | | | |
|---|---|---|---|---|
| 6,345,162 | B1 * | 2/2002 | Ozawa et al. | 399/61 |
| 6,668,142 | B2 * | 12/2003 | Nakaue et al. | 399/43 |
| 2006/0193650 | A1 * | 8/2006 | Takenouchi et al. | 399/27 |
| 2011/0262161 | A1 * | 10/2011 | Fukuda et al. | 399/59 |

FOREIGN PATENT DOCUMENTS

JP    2007-079233    3/2007

* cited by examiner

*Primary Examiner* — Sophia S Chen
(74) *Attorney, Agent, or Firm* — Stanzione & Kim, LLP

(57) ABSTRACT

An image forming apparatus is provided. The image forming apparatus includes a developing unit which contains a mixture of toner and carrier, a toner sensor which is disposed in the developing unit, and a controller which determines a control voltage for the toner sensor using change information on a change in a quantity of electric charge which changes according to a time during which the image forming apparatus is used or paused, and drives the toner sensor using the determined control voltage and compensates for an output value of the toner sensor. Accordingly, toner can be prevented from being supplied excessively.

20 Claims, 11 Drawing Sheets

IMAGE FORMING APPARATUS AND METHOD OF CONTROLLING DEVELOPING UNIT THEREOF

CROSS-REFERENCE TO RELATED APPLICATIONS

This application claims priority under 35 U.S.C. §119 from Korean Patent Application No. 10-2012-0053788, filed on May 21, 2012 in the Korean Intellectual Property Office, the disclosure of which is incorporated herein by reference in its entirety.

BACKGROUND OF THE INVENTION

1. Field of the Invention

Methods and apparatuses consistent with exemplary embodiments relate to an image forming apparatus and a method of controlling a developing unit thereof, and more particularly, to an image forming apparatus which compensates for an output value of a permeability sensor in a developing unit and controls toner supply, and a method of controlling a developing unit thereof.

2. Description of the Related Art

With the development of electronic technologies, various kinds of electronic apparatuses have been developed and distributed. Such electronic apparatus may display various contents and may be connected to an image forming apparatus to output the contents.

An image forming apparatus may be realized in various ways such as an ink jet method and a laser printing method. An image forming apparatus of the laser printing method may be divided into a 1-component developing method using only toners and a 2-component developing method using toners and carriers altogether.

The 1-component developing method is simple and is beneficial to miniaturization. In comparison to this method, the 2-component developing method is capable of developing at a high speed and shows good performance in reproducing gradation.

The 2-component developing method refers to a method that performs developing by mixing toners and carriers. The 2-component developing method should constantly maintain a concentration of toners in a developing agent. Accordingly, the image forming apparatus senses a toner concentration from a mixture of toners and carriers in a developing unit. As a result of sensing, if the toner concentration is low, more toners are supplied to the developing unit from a toner bottle, and, if the toner concentration is high, toner supply is restricted.

However, the toner concentration may be differently sensed according to a use time or a pause time of the image forming apparatus. Specifically, the image forming apparatus measures a quantity of electric charge of the mixture of the toners and the carriers contained in the developing unit, and senses the toner concentration according to the quantity of electric charge.

However, the quantity of electric charge in the developing unit may vary according to whether the image forming apparatus is used or not. For example, if the image forming apparatus is not used and is paused, a quantity of electric charge per unit mass decreases. In this case, the toner supply is controlled based on the decreased quantity of electric charge. Accordingly, the toners may be supplied excessively or insufficiently.

This may cause a problem that toners are scattered in the image forming apparatus or a problem that an image concentration is made non-uniform.

SUMMARY OF THE INVENTION

One or more exemplary embodiments may overcome the above disadvantages and other disadvantages not described above. However, it is understood that one or more exemplary embodiment are not required to overcome the disadvantages described above, and may not overcome any of the problems described above.

One or more exemplary embodiments provide an image forming apparatus which is capable of controlling toner supply appropriately by adjusting a control voltage of a sensor for measuring a quantity of electric charge, appropriately, and compensating for a sensor output value, and a method of controlling a developing unit thereof.

Additional features and utilities of the present general inventive concept will be set forth in part in the description which follows and, in part, will be obvious from the description, or may be learned by practice of the general inventive concept.

According to features and utilities of an exemplary embodiment, there is provided an image forming apparatus including: a developing unit which contains a mixture of toner and carrier, a toner sensor which is disposed in the developing unit, and a controller which determines a control voltage for the toner sensor using change information on a change in a quantity of electric charge which changes according to a time during which the image forming apparatus is used or paused, and drives the toner sensor using the determined control voltage to compensate an output value of the toner sensor.

The toner sensor may be driven according to the control voltage and may measure a quantity of electric charge per unit mass of a developing agent of the developing unit, in which toner and carrier are mixed.

The controller may adjust an amount of toner to be supplied to the developing unit based on an output value of the toner sensor.

The image forming apparatus may further include: a counter unit which counts a number of revolutions of a developing roller of the developing unit and a pause time of the image forming apparatus, a first storage unit which stores information on an initial control voltage which is matched with each quantity of electric charge, and a second storage unit which stores the change information.

The controller may calculate a voltage compensation value using the number of revolutions, the pause time, and the change information, may detect an initial control voltage matched with an initial quantity of electric charge sensed by the toner sensor from the first storage unit, and may calculate the control voltage by adding the voltage compensation value to the detected initial control voltage.

The change information may include a parameter value which is obtained by normalizing an output value of the toner sensor which changes with time within a predetermine range.

The controller may calculate an initial parameter value at a time when the image forming apparatus is driven using a parameter value lastly stored in the second storage unit from among the parameter values, may calculate a new parameter value at a time when the image forming apparatus is driven using the initial parameter value and may calculate the voltage compensation value based on the calculated new parameter value.

The controller may calculate the initial parameter value RPa using equation 1, $RPa=RPmax(RPmax-RPz)*\exp(-Mn/256)$, may calculate the new parameter value RPz' using equation 2, $RPz'=RPa*\exp(Rv/256)$, and may calculate the voltage compensation value using equation 3, $RPCV=(RPz'/K)$. In the equations 1, 2, and 3, RPz may be a parameter value which is lastly calculated and stored, RPmax may be a maximum value from among the pre-calculated parameter values, Mn may be a pause time during which the image forming apparatus is paused, Rv may be a number of revolutions of the developing roller, and K may be a predetermined factor to determine an amount of correction.

The image forming apparatus may further include a sensor unit which senses at least one of temperature and humidity of the image forming apparatus, and the second storage unit may store lifespan information of the developing unit.

The controller may calculate the control voltage by adding an environment compensation value corresponding to a sensing result of the sensor unit, a lifespan compensation value corresponding to the lifespan information, and a speed compensation value corresponding to a job processing speed of the image forming apparatus to the initial control voltage along with the voltage compensation value.

The controller may calculate the control voltage and update the control voltage at predetermined time intervals.

If a predetermined pause time elapses in a state where an operation of the image forming apparatus is stopped or if a predetermined driving time elapses after driving of the image forming apparatus is started, the controller may maintain the voltage compensation value for the control voltage.

According to features and utilities of another exemplary embodiment, there is also provided a method of controlling a developing unit of an image forming apparatus which includes a developing unit which contains a mixture of toner and carrier, and a toner sensor which is disposed in the developing unit, the method including: if an image forming job is started, calculating a level of a control voltage for the toner sensor using change information on a change in a quantity of electric charge which changes according to a use or pause time of the image forming apparatus, providing the calculated level of the control voltage to the toner sensor and driving the toner sensor, if the toner sensor is driven by the control voltage and senses a quantity of electric charge per unit mass of a developing agent in which toner and carrier are mixed, adjusting an amount of toner to be supplied to the developing unit based on an output value of the toner sensor.

The calculating of the level of the control voltage may include: counting a number of revolutions of a developing roller of the developing unit and a pause time of the image forming apparatus, calculating a voltage compensation value using the number of revolutions, the pause time, and the change information, and adding the voltage compensation value to an initial control voltage which is matched with an initial quantity of electric charge sensed by the toner sensor and determining a result value of the adding as the level of the control voltage.

The change information may include a parameter value which is obtained by normalizing an output value of the toner sensor which changes with time within a predetermine range.

The calculating of the voltage compensation value may include: calculating an initial parameter value at a time when the image forming apparatus is driven using a parameter value lastly calculated and stored from among the parameter values, calculating a new parameter value at a time when the image forming apparatus is driven using the initial parameter value, and calculating the voltage compensation value based on the calculated new parameter value.

The initial parameter value may be calculated using equation 1, $RPa=RPmax(RPmax-RPz)*\exp(-Mn/256)$, the new parameter value may be calculated using equation 2, $RPz'=RPa*\exp(Rv/256)$, and the voltage compensation value may be calculated using equation 3, $RPCV=(RPz'/K)$.

In the equations 1, 2, and 3, RPa may be the initial parameter value, the RPz' may be the new parameter value, RPCV may be the voltage compensation value, RPz may be a parameter value which is lastly calculated and stored, RPmax may be a maximum value from among the pre-calculated parameter values, Mn may be a pause time during which the image forming apparatus is paused, Rv may be a number of revolutions of the developing roller, and K may be a predetermined factor to determine an amount of correction.

The method may further include sensing at least one of temperature and humidity of the image forming apparatus.

The calculating of the level of the control voltage may include calculating the level of the control voltage by adding an environment compensation value corresponding to at least one of the sensed temperature and the humidity, a lifespan compensation value corresponding to lifespan information of the developing unit, and a speed compensation value corresponding to a job processing speed of the image forming apparatus to the initial control voltage along with the voltage compensation value.

The method may further include updating the control voltage at predetermined time intervals.

If a predetermined pause time elapses in a state where an operation of the image forming apparatus is stopped or if a predetermined driving time elapses after driving of the image forming apparatus is started, the voltage compensation value for the control voltage may be maintained.

According to features and utilities of another exemplary embodiment, there is also provided an image forming apparatus including a developing unit that contains a developing agent including toner and carrier, a toner sensor to measure a quantity of electric charge of the developing agent and to output an output value, and a controller to compensate the output value of the toner sensor based on a change in the quantity of electric charge, the change occurring according to driving or pausing of the image forming apparatus, and to control an amount of toner to be supplied to the developing unit according to the compensated output value.

The controller may determine a control voltage for the toner sensor to compensate the output value of the toner sensor according to the change in the quantity of electric charge.

The change in the quantity of electric charge during the driving of the image forming apparatus may be an increase in the quantity of electric charge, and the controller may compensate the output value of the toner sensor by applying the control voltage that is decreased to adjust for the increase in the quantity of electric charge.

The change in the quantity of electric charge during the pausing of the image forming apparatus may be a decrease in the quantity of electric charge, and the controller may compensate the output value of the toner sensor by applying the control voltage that is increased to adjust for the decrease in the quantity of electric charge.

The increase in the quantity of electric charge may be an exponential function that reaches a first saturation point and stays at the first saturation point.

The decrease in the quantity of electric charge may be an inverse exponential function that reaches a second saturation point and stays at the second saturation point.

The output of the toner sensor may be further compensated according to at least one of a sensing result of a sensor unit, lifespan information of the developing unit, and a job processing speed of the image forming apparatus.

According to the various exemplary embodiments described above, the toner concentration is exactly determined and accordingly the toner supply is controlled, so that toner scattering and an non-uniform concentration can be prevented.

BRIEF DESCRIPTION OF THE DRAWINGS

These and/or other features and utilities of the present general inventive concept will be more apparent and more readily appreciated from the following description of the embodiments, taken in conjunction with the accompanying drawings, in which.

DETAILED DESCRIPTION OF THE PREFERRED EMBODIMENTS

Figure 1:
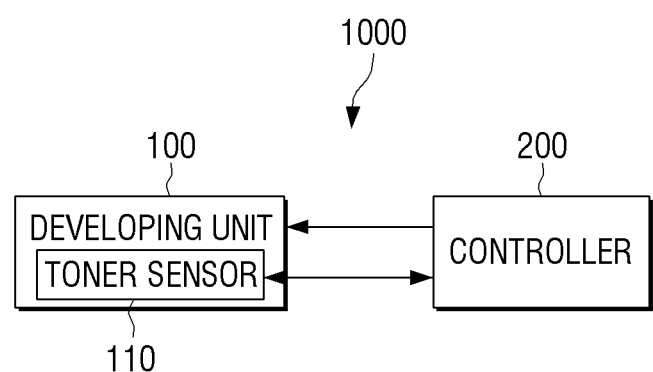
FIG. 1 is a block diagram illustrating an image forming apparatus according to an exemplary embodiment.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

In the following description, same reference numerals are used for the same elements when they are depicted in different drawings. The matters defined in the description, such as detailed construction and elements, are provided to assist in a comprehensive understanding of exemplary embodiments. Thus, it is apparent that exemplary embodiments can be carried out without those specifically defined matters. Also, functions or elements known in the related art are not described in detail since they would obscure the exemplary embodiments with unnecessary detail.

FIG. 1 is a block diagram illustrating an image forming apparatus according to an exemplary embodiment. Referring to FIG. 1, an image forming apparatus 1000 includes a developing unit 100 and a controller 200. The image forming apparatus 1000 may be realized by various types of apparatuses such as printers, copiers, facsimile machines, multi-function peripherals, and so on. The image forming apparatus 1000 may be operated in various methods such as a dot printing method, an ink jet method, and a laser printing method. In this specification, an embodiment where the image forming apparatus 1000 adopts a laser printing method using a 2-component developing agent will be explained as an example.

The image forming apparatus 1000 of the laser printing method may include various components such as a charging unit, a laser scanning unit, a transfer unit, a fusing unit, a paper feeding unit, and a paper discharging unit, in addition to the developing unit 100. The components will be explained in detail below and an essential component of the present invention is explained in FIG. 1.

Referring to FIG. 1, the developing unit 100 includes a toner sensor 110. The developing unit 100 contains a mixture of toners and carriers. The carrier may be realized by a conductive carrier formed by coating an iron or ferrate surface with an oxidation or low-resistance resin, or may be realized by an insulating carrier formed by coating an iron or ferrate surface with an insulating resin (a fibrous or silicon resin).

The toner sensor 110 is disposed in the developing unit 100 to measure a quantity of electric charge per unit mass of a developing agent in which toners and carriers are mixed. Since the toner has a quantity of negative (−) electric charge and the carrier has a quantity of positive (+) electric charge, the controller 200 may sense a toner concentration based on the quantity of electric charge measured by the toner sensor 110. The toner sensor 110 may be realized by a permeability sensor or a conductivity sensor. If the toner concentration in the developing agent decreases, a concentration of the carrier which is a magnetic substance relatively increases in relative to the toner concentration and thus permeability increases. On the other hand, if the toner concentration increases, the concentration of the carrier which is a magnetic substance relatively decreases in relative to the toner concentration and thus the permeability decreases.

The controller 200 determines a control voltage for the toner sensor 110 using change information on a change in the quantity of electric charge which changes according to a use or pause time of the image forming apparatus 1000. The controller 200 provides a control voltage of the determined level to the toner sensor 110 and drives the toner sensor 110. The toner sensor 110 is driven by the control voltage and senses the quantity of electric charge per unit mass (Q/m) of the mixture of the toners and the carriers in the developing unit 100.

Since the level of the control voltage of the toner sensor 110 is adjusted based on the change information of the quantity of electric charge, the quantity of electric charge per unit mass output from the toner sensor 110 is a value that is appropriately compensated for the change in the quantity of electric charge according to the pause time or the use time of the image forming apparatus 1000. As a result, the controller 200 obtains information on the quantity of electric charge after compensating for an effect caused by the pause time and controls to toner supply accordingly.

Although a single developing unit 100 is illustrated in FIG. 1, a plurality of developing units 100 may be provided in the case of a color image forming apparatus. For example, four developing units including black (K), cyan (C), magenta (M), and yellow (Y) developing agents to form a color image may be included. An inner configuration of the developing unit 100 may be different according to a type and a characteristic of a product and thus a detailed description of the inner configuration of the developing unit 100 is omitted.

The controller 200 adjusts an amount of toner to be supplied to the developing unit 100 based on the toner concentration sensed by the toner sensor 110. Specifically, the controller 200 controls an amount of toner supplied to the developing unit 100 from a toner bottle connected to the developing unit 100. Accordingly, a concentration of a 2-component developing agent can be constantly maintained. As a result, the toner can be prevented from being scattered in a set and also an image concentration can be prevented from being non-uniform.

Figure 2:
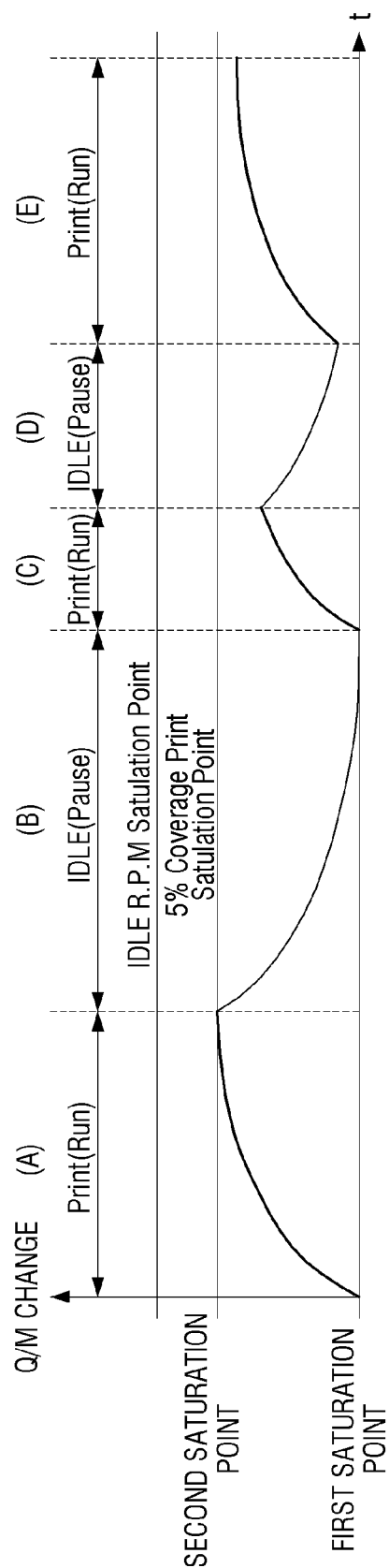
FIG. 2 is a graph illustrating a change in a quantity of electric charge according to driving or pause of the image forming apparatus.

FIG. 2 is a graph illustrating a change in a quantity of electric charge according to driving or pausing of the image forming apparatus. Referring to FIG. 2, a state of the image forming apparatus 1000 is divided into driving periods A, C, and E and pause periods B and D. Each of the driving periods A, C, and E refers to a respective period during which the image forming apparatus 1000 performs various image forming jobs such as printing and copying using the developing unit. Each of the pause periods B and D refers to a respective period during which the image forming apparatus 1000 is not used and is idle.

If the image forming apparatus 1000 is used, the developing unit 100 is driven and accordingly a quantity of electric charge per unit mass (Q/m) of the developing agent, which is the mixture of the toners and the carriers, contained in the developing unit 100 is changed. Referring to FIG. 2, if the image forming apparatus 1000 is paused for more than a predetermined time, the quantity of electric charge is maintained at a first saturation point, and, if the image forming apparatus 1000 is used for more than a predetermined time, the quantity of electric charge is maintained at a second saturation point.

In FIG. 2, in the state in which the quantity of electric charge is maintained at the first saturation point due to a long-time pause, if the image forming apparatus is started and enters driving period A, the quantity of electric charge per unit mass (Q/m) gradually increases. The quantity of electric charge increases according to an exponential characteristic. In this state, if a predetermined time elapses, the quantity of electric charge is maintained at the second saturation point. If the use of the image forming apparatus is finished, the image forming apparatus enters pause period B. In pause period B, the quantity of electric charge decreases according to an inverse exponential function.

If the use of the image forming apparatus is finished in a state in which the quantity of electric charge does not increase to the second saturation point as in driving period C, pause period D is started and discharge is started without the quantity of electric charge reaching the second saturation point. In addition, in driving period E, the image forming apparatus may be started to be used again before the quantity of the electric charge is decreased during pause period D to the first saturation point.

Figure 3:
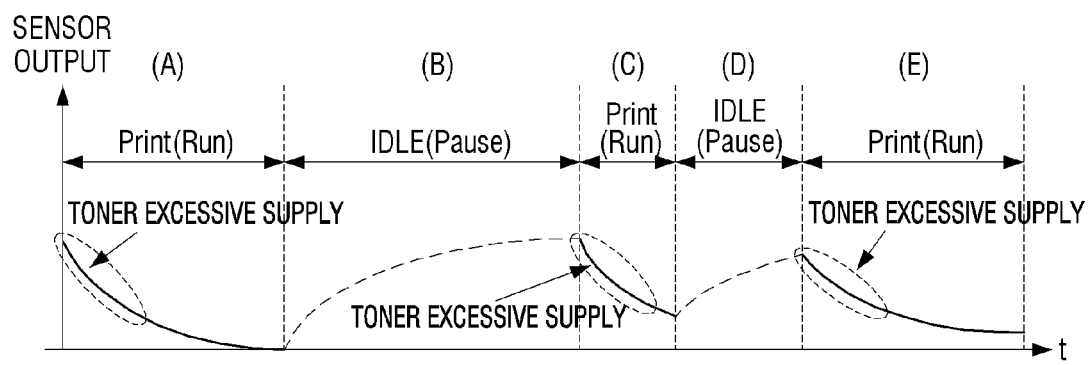
FIG. 3 is a graph illustrating a change in an output value of a toner sensor according to a change in a quantity of electric charge.

FIG. 3 is a view illustrating excessive supply of toner which may occur if a control voltage is supplied based on a quantity of electric charge changing as shown in FIG. 2. Because the sensor output value is inverse of the quantity of electric charge per unit mass (Q/m), as the quantity of electric charge increases in driving period A (as illustrated in FIG. 2), the sensor output decreases in driving period A, as illustrated FIG. 3. Referring to FIG. 3, if the image forming apparatus is started and enters driving period A, although an actual toner concentration is constant, a value greater than an actual toner sensor output value may be output in the beginning portion of period A, and then gradually decrease over driving period A, according to a change in a quantity of electric charge per unit mass (Q/m). In this case, based on the quantity of electric charge, a related-art apparatus determines the toner concentration to be lower than the actual toner concentration, and thus additionally supplies toner based on the determined toner concentration. Similar occurrence is observed in driving periods C and E, as illustrated in FIG. 3. Accordingly, the toner may be excessively supplied in every driving period A, C, and E as shown in FIG. 3.

In order to prevent such a problem, the controller 200 adjusts a control voltage for the toner sensor using change information on a change in a quantity of electric charge. Accordingly, the adjusted control voltage is supplied to the toner sensor 110 so that an output value of the toner sensor 100 can be compensated for the change in the quantity of electric charge according to an actual toner concentration. The controller 200 adjusts an amount of toner based on the compensated output value.

Figure 4:
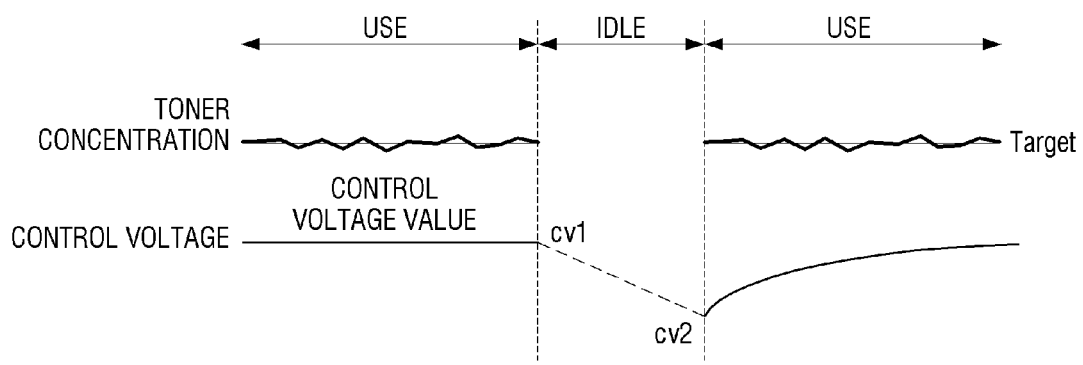
FIG. 4 is a graph illustrating a state in which an output value of a toner sensor is compensated by adjusting a control voltage considering a pause time.

FIG. 4 is a graph illustrating a waveform of a control voltage adjusted by the controller 200. Referring to FIG. 4, a toner concentration is maintained at a target value (TC Target) while the image forming apparatus 1000 is used. The control voltage is constantly maintained at CV1 according to the toner concentration.

In this state, if the image forming apparatus is paused for a predetermined time and is used again, the control voltage is reduced to CV2 and is provided to the toner sensor 110 in order to prevent an output of the toner sensor 110 from being increased at a time when the image forming apparatus is started. The controller 200 starts the use of the image forming apparatus with the reduced control voltage (CV2), continuously increases the control voltage, and maintains the control voltage at CV1 again after a predetermined time. That is, the control voltage is adjusted to compensate for the change in the quantity of electric charge.

By adjusting the control voltage as shown in FIG. 4 and compensating for the output value of the toner sensor 100, problems such as toner scattering or a non-uniform image concentration can be prevented.

Figure 5:
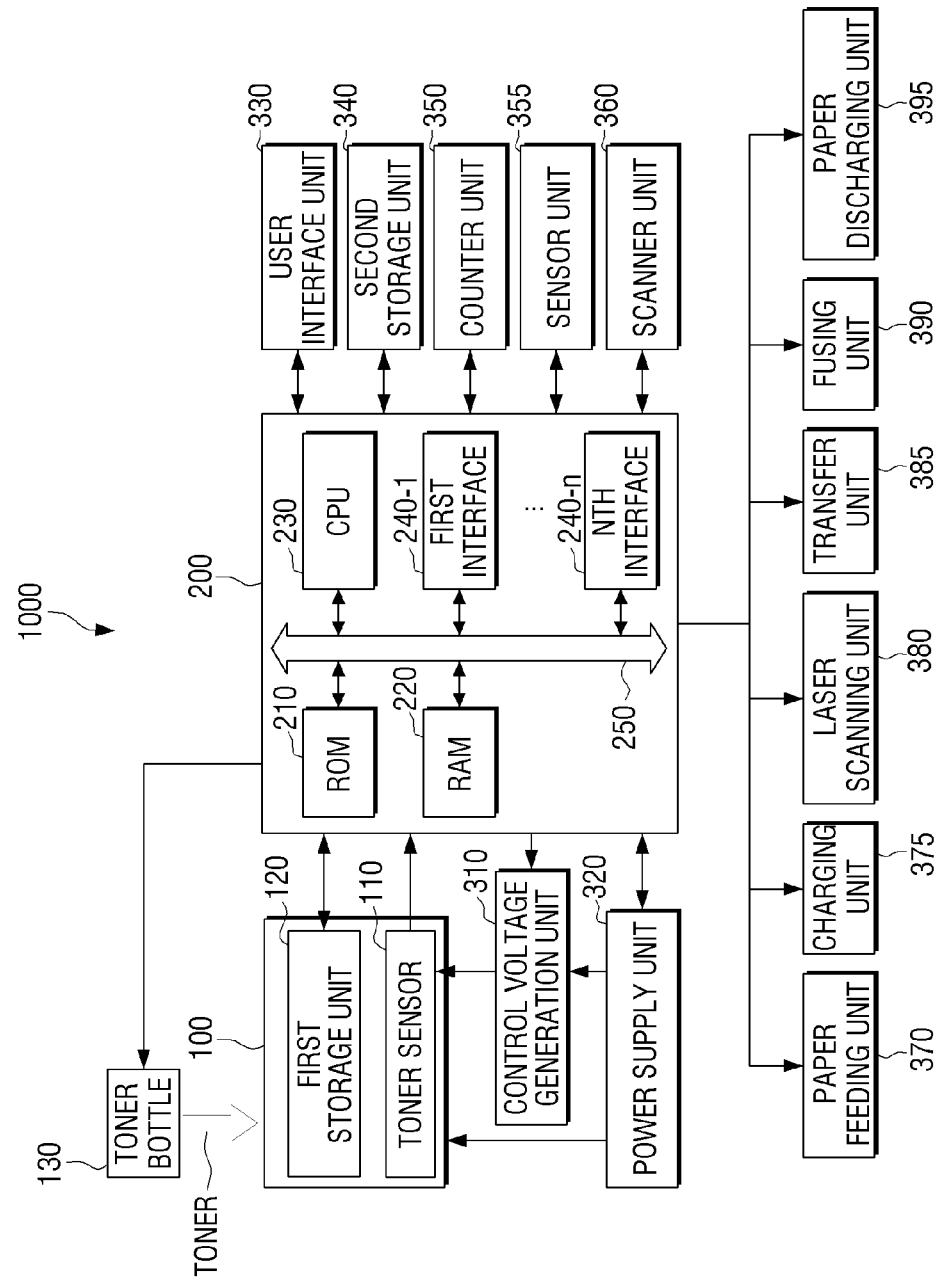
FIG. 5 is a block diagram to explain an image forming apparatus overall according to various exemplary embodiments.

FIG. 5 is a block diagram illustrating an image forming apparatus 1000 according to various exemplary embodiments. In FIG. 5, the image forming apparatus 1000 is realized by a multifunction peripheral.

Referring to FIG. 5, the image forming apparatus 1000 includes a developing unit 100, a toner bottle 130, a controller 200, a control voltage generation unit 310, a power supply unit 320, a user interface unit 330, a second storage unit 340, a counter unit 350, a sensor unit 355, a scanner unit 360, a paper feeding unit 370, a charging unit 375, a laser scanning unit 380, a transfer unit 385, a fusing unit 390, and a paper discharging unit 395.

The developing unit 100 includes a toner sensor 110 and a first storage unit 120. The developing unit 100 is connected to the toner bottle 130 and receives toner from the toner bottle 130. Although a single developing unit 100 and a single toner bottle 130 are illustrated in FIG. 5, the number of developing units 100 and the number of toner bottles 130 and placement locations thereof may be different according to the number of colors.

The first storage unit 120 stores information on an initial control voltage which corresponds to the image forming apparatus 1000 and is matched with each quantity of electric charge. A manufacturer of the image forming apparatus 1000 searches for an appropriate initial control voltage according to a quantity of electric charge by repeating experiments, and stores information on the initial control voltage in the first storage unit 120. The manufacturer may search for an initial control voltage to maintain a toner concentration by changing a lifespan of the image forming apparatus 1000 and environmental state information such as temperature or humidity of an environment where the image forming apparatus 1000 is used, as well as the quantity of electric charge, and may store this initial control voltage in the first storage unit 120.

In FIG. 5, the first storage unit 120 is provided in a customer replaceable unit monitoring (CRUM) chip mounted in the developing unit 100. The CRUM chip is an element that is mounted in a replaceable consumable unit such as a developing unit and records a variety of information. If the first storage unit 120 is provided in the CRUM chip of the developing unit 100, the first storage unit 120 may store a variety of information on the developing unit 100 besides the information on the initial control voltage. Specifically, the first storage unit 120 may store a variety of characteristic information on the developing unit 100, the CRUM chip, and the image forming apparatus 1000, usage information regarding performance of an image forming job, unique information or programs. The unique information refers to information that can identify the CRUM chip or the developing unit 100. For example, the unique information may be a serial number. The characteristic information may include information on a manufacturer of the developing unit 100, information on a manufacturer of the image forming apparatus 1000, an apparatus name of a mountable image forming apparatus, information on a manufacturing date, a serial number, a model name, electronic signature information, an encryption key, and an encryption key index. The usage information may include information on how many copies have been made up to now, how many copies can be made, and an amount of residual toner. The characteristic information may be referred as unique information. The first storage unit 120 may store a variety of information regarding use of the toner sensor 100.

The toner bottle 130 contains toners to be supplied to the developing unit 100. The toner bottle 130 includes a toner supply roller (not shown) to supply toners to be mixed with carriers and a toner agitating roller (not shown) to agitate toners to prevent the toners from agglomerating. The controller 200 provides a driving signal to the toner supply roller and controls whether to supply toners or not.

Although not shown in FIG. 5, besides the toner sensor 100 and the first storage unit 120, various components such as a developing roller, an organic photo conductor (OPC), a cleaning blade, and a return roller may be further included in the developing unit 100.

The control voltage generation unit 310 generates a control voltage to be applied to the toner sensor 110.

The controller 200 determines a level of the control voltage based on an output value sensed by the toner sensor 110 and controls the control voltage generation unit 310 to apply the control voltage of the predetermined level to the toner sensor 110.

The control voltage generation unit 310 generates the control voltage using power supplied from the power supply unit 320 under the control of the controller 200, and provides the generated control voltage to the toner sensor 100. The control voltage generation unit 310 may include a rectifying circuit and a switch. Accordingly, the control voltage generation unit 310 is driven according to control of the controller 200 and adjusts a duty ratio of the control voltage.

The power supply unit 320 supplies power to the components in the image forming apparatus 1000. Specifically, the power supply unit 320 receives commercial use alternating current (AC_IN) power from an external source and converts it into direct current (DC) power of an electric potential level suitable for each component using an element such as a transformer, an inverter, and a rectifier, and outputs the DC power (DC_OUT).

The user interface unit 330 is a component to receive various selection signals from a user. The user interface unit 330 includes a touch screen, a button, and so on.

The second storage unit 340 stores a variety of information such as specification of the image forming apparatus, a use state, printing data, scan data, pre-processed data, setting information set by the user, use history information, and various application programs and an operating system (O/S) used in the image forming apparatus 1000.

The controller 200 may perform various operations using a program stored in the second storage unit 340.

The controller 200 includes a read only memory (ROM) 210, a random access memory (RAM) 220, a central processing unit (CPU) 230, first to n-th interfaces 240-1~240-n, and a bus 250.

The ROM 210, the RAM 220, the CPU 230, and the first to the n-th interfaces 240-1~240-n are connected to one another through the bus 250, and exchange various data and signals with one another.

The CPU 230 accesses the second storage unit 340 and performs booting using the O/S stored in the second storage unit 340. Also, the CPU 230 performs various operations using various programs, contents, and data stored in the second storage unit 340.

Specifically, the ROM 210 stores a command set to boot a system. If a turn-on command is input and power is supplied, the CPU 230 copies the O/S stored in the second storage unit 340 to the RAM 220 according to a command stored in the ROM 210, executes the O/S, and boots the system. If the booting is completed, the CPU 230 copies various programs stored in the second storage unit 340 to the RAM 220, executes the program copied to the RAM 220, and performs various operations.

Specifically, if a job command to perform an image forming job is input, the CPU 230 controls the components to perform the image forming job. In this process, the CPU 230 senses a state of the developing unit and supplies toners to the developing unit. This operation will be explained in detail below.

The first to the n-th interfaces 240-1~240-n may include an interface which is connected to an external apparatus through a network or a local interface and receives data and commands, an interface which is connected to the components of the image forming apparatus 1000 to exchange data with the components, and an interface which communicates with various external apparatuses connected to the image forming apparatus 1000 such as a USB memory.

The controller 200 controls an overall image forming apparatus set according to data and a command. The command may be a command transmitted from an external apparatus connected through one of the first to the n-th interfaces 240-1~240-n such as a host device, and/or a user selection command input through the user interface 330 of the image forming apparatus 1000.

Specifically, if a printing command is executed in a printer driver or an application installed in an external apparatus, the printer driver of the external apparatus generates printing data by converting a corresponding document into a predetermined printer language. The controller 200 receives the generated printing data through the first interface 240-1, for example.

Figure 6:
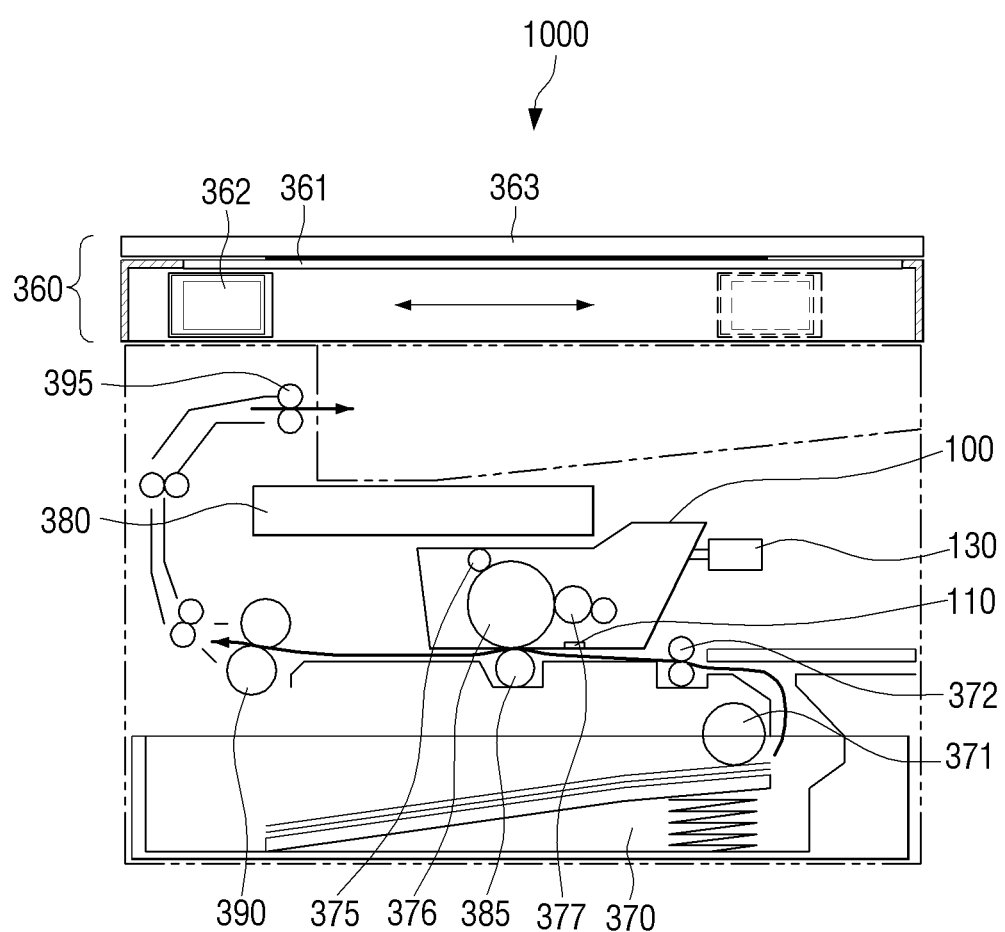
FIG. 6 is a cross section view to explain an inner configuration of the image forming apparatus.

The controller 200 converts the printing data into a bitmap image consisting of "0" and "1" using a halftone table, and controls the paper feeding unit 370, the charging unit 375, the laser scanning unit 380, the transfer unit 385, the fusing unit 390, and the paper discharging unit 395 to print the bitmap image on paper. FIG. 6 is a cross section view illustrating an example of the image forming apparatus 1000 including various components to perform printing.

Referring to FIG. 6, paper is fed from the paper feeding unit 370 and is conveyed by conveyance rollers 371 and 372. A surface of the OPC 376 in the developing unit 100 is charged by the charging unit 375 and a latent image is formed on a charged region by the laser scanning unit 380. In this state, if developing is performed by the developing unit 100, toners are transferred via a developing roller 377 and attached to the latent image on the OPC 376 and the toners attached to the latent image on the OPC 376 are transferred to the paper by the transfer unit 385. The transferred toners are fused into the paper by the fusing unit 390. The paper onto which the toners are fused is discharged to the outside by the paper discharging unit 395. Although the OPC and the charging unit 375 are integrally formed with each other in the developing unit 100 in FIG. 6, the developing unit 100 may be manufactured without the OPC or the charging unit 375.

The toner sensor 110 is disposed on a bottom surface in the developing unit 100, and the toner bottle 130 is disposed on one side of an outer surface of the developing unit 100 and is connected to the developing unit 100.

Also, as shown in FIG. 6, the scanner unit 360 may be disposed on a top of the image forming apparatus 1000. The scanner unit 360 may include a flat panel 361 on which an object to be scanned is placed, a scanning unit 362 which is disposed under the flat panel 361 to be able to reciprocate, and a flat panel cover 363 which covers the flat panel 361.

If a scan command is input through the user interface unit 330, the controller 200 controls the scanner unit 360 to perform a scan job. The scanner unit 360 includes the scanning unit which scans an object using an image read-out sensor, a lens, and a light source, and generates scanning data by performing processing such as shading and gamma correction, dot per inch (DPI) conversion, edge emphasis, error diffusion, and scaling with respect to the image data scanned by the scanning unit. The scanner unit 360 may include a scan motor unit which moves an image processing unit, a scanning unit or paper to scan an entire target document.

FIGS. 5 and 6 illustrate the image forming apparatus 1000 which is realized by a multifunction peripheral and thus includes the scanner unit 360. However, the image forming apparatus 1000 may be a printer without the scanner unit 360.

The sensor unit 355 is a component to sense an environment state of the image forming apparatus 1000 such as temperature or humidity. The sensor unit 355 may include a temperature sensor such as a thermister and may also include a humidity sensor. The controller 200 may adjust sizes of various signals such as a transfer voltage or a charging voltage using the environment state information sensed by the sensor unit 355.

If a job command is input and an image forming job is started, the controller 200 controls a toner supply state in the developing unit 100.

Specifically, the CPU 230 drives the counter unit 350 to count the number of revolutions of a developing roller provided in the developing unit 100 and a pause time of the image forming apparatus, respectively. Although a single counter unit 350 is illustrated in FIG. 5, the counter unit 350 may include counters such as a revolution counter to count the number of revolutions of a developing roller and a time counter to count time.

The CPU 230 stores the number of revolutions and the pause time in the second storage unit 330.

The CPU 230 calculates a voltage compensation value using the number of revolutions, the pause time, and the change information stored in the second storage unit 340. The CPU 230 detects an initial control voltage, which is matched with an initial quantity of electric charge sensed by the toner sensor 110, from the first storage unit 120, and adds the voltage compensation value to the detected initial control voltage, thereby calculating a control voltage. The change information includes a parameter value that is obtained by normalizing an output value of the toner sensor, which changes with time, within a predetermined range. The parameter value (RP) varies according to a pause time or a use time.

Figure 7:
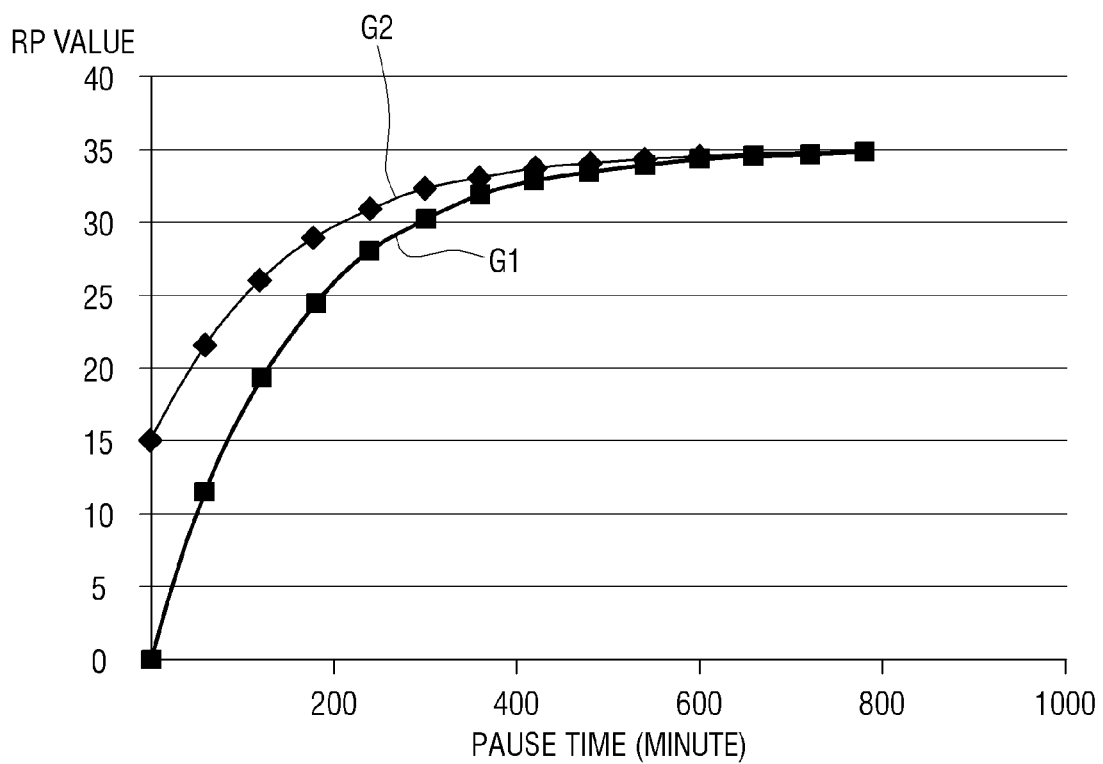
FIG. 7 is a graph illustrating a characteristic that a parameter value, which is obtained by normalizing an output value of a toner sensor within a predetermined range, changes during a pause time.

FIG. 7 is a graph illustrating a change in the RP value if the image forming apparatus 1000 is paused. Referring to FIG. 7, two graphs G1 and G2 appear if there are different maximum values (RPmax) from among pre-calculated parameter values. The two graphs show that the RP value gradually increases if the pause time increases.

Figure 8:
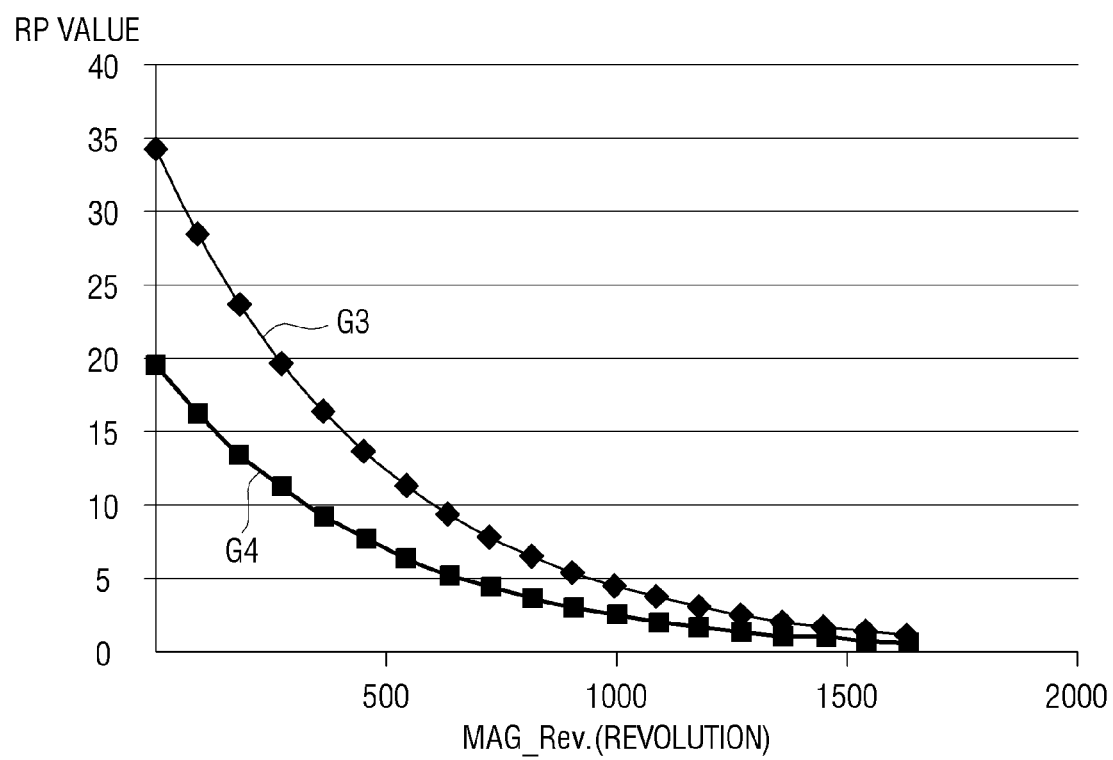
FIG. 8 is a graph illustrating a characteristic that a parameter value, which is obtained by normalizing an output value of a toner sensor within a predetermined range, changes during a driving time.

FIG. 8 is a graph illustrating a change in the RP value if the image forming apparatus 1000 is used. As illustrated in FIG. 8, the RP value decreases as the number of revolutions of the developing roller increases. Referring to FIG. 8 two graphs G3 and G4 appear if there are different maximum values (RPmax) from among pre-calculated parameter values. The two graphs show that the RP value gradually increases according to a pause time (see FIG. 7), and gradually decrease according to the number of the revolutions (see FIG. 8).

The manufacturer of the image forming apparatus 1000 may adjust an output resolution of the toner sensor 110 based on the maximum value (RPmax) of the RPz, which is a last parameter value that is calculated and stored.

The CPU 230 of the controller 200 may control all of the change in the output of the toner sensor 110 and the change in the image concentration based on the RP value which changes as shown in FIGS. 7 and 8.

Specifically, the CPU 230 calculates an initial parameter value at a time when the image forming apparatus 1000 is started to be driven using a parameter value lastly stored in the second storage unit 340 from among the parameter values.

The initial parameter value may be calculated by the following equation:

$$RPa = RPmax(RPmax - RPz) * \exp(-Mn/256) \qquad \text{[Equation 1]}$$

wherein RPa is an initial parameter value, RPz is a parameter value that is lastly calculated and stored, RPmax is a maximum value from among pre-calculated parameter values, and Mn is a pause time during which the image forming apparatus is paused.

The CPU 230 calculates a new parameter value at a time while the image forming apparatus 1000 is driven using the initial parameter value. The new parameter value may be calculated by the following equation:

$$RPz' = RPa * \exp(Rv/256) \qquad \text{[Equation 2]}$$

wherein RPz' is a new parameter value and Rv is the number of revolutions of a developing roller.

If the new parameter value (RPz') is calculated, the CPU 230 calculates a voltage compensation value using the following equation:

$$RPCV = (RPz'/K) \qquad \text{[Equation 3]}$$

wherein RPCV is the voltage compensation value, and K is a predetermined factor to determines an amount of correction. The K value may be set differently according to various criteria such as a lifespan and an environment of the image forming apparatus 1000. The K value is used so that the voltage compensation value can be adjusted appropriately reflecting a state and an environment of the image forming apparatus 1000.

If the voltage compensation value is calculated, the CPU 230 may calculate a control voltage using the following equation:

$$CV=IV+RPCV \quad \text{[Equation 4]}$$

wherein CV is a control voltage, IV is an initial control voltage, and RPCV is the voltage compensation value.

If the sensor unit 355 is further included as shown in FIG. 5, the controller 200 may calculate a control voltage by adding an environment compensation value corresponding to a result of sensing by the sensor unit 355, that is, for example, temperature or humidity, to the initial control voltage along with the voltage compensation value. That is, if the environment state such as temperature or humidity changes, the quantity of electric charge of the developing agent in the developing unit 100 changes accordingly and thus the toner sensor 110 outputs an output value different from an actual concentration due to the change in the environment state.

The environment compensation value may be calculated in advance by repeating experiments and may be stored in the second storage unit 340. That is, the manufacturer may calculate an environment compensation value corresponding to a use environment factor in advance by changing the use environment factor such as temperature and humidity differently, and then may arrange that value in a database and store the database in the second storage unit 340. For example, the manufacturer may calculate environment compensation values for various temperature values or humidity values. The controller 200 may detect an environment compensation value matched with the sensor unit 355 based on the database stored in the second storage unit 340.

If the first storage unit 120 or the second storage unit 340 stores lifespan information of the developing unit 100, the controller 200 may calculate a control voltage by adding a lifespan compensation value corresponding to the lifespan information of the developing unit 100 to the initial control voltage along with the voltage compensation value.

The controller 200 may calculate a control voltage by adding a speed compensation value corresponding to a job processing speed of the image forming apparatus 100 to the initial control voltage along with the voltage compensation value.

Like the environment compensation value, the lifespan compensation value and the speed compensation value may be calculated in advance and stored in the second storage unit 340.

The additional compensation values such as the environment compensation value, the lifespan compensation value, and the speed compensation value may be reflected solitarily or in combination with one another. If all of the compensation values are reflected, the controller 200 may determine a control voltage according to the following equation:

$$CV=IV+\text{environment compensation value}+\text{lifespan compensation value}+\text{speed compensation value}+RPCV \quad \text{[Equation 5]}$$

The controller 200 may calculate the control voltage at predetermined time intervals. Accordingly, the control voltage may be frequently updated. Also, if a predetermined pause time elapses when the operation of the image forming apparatus is stopped or if a predetermined driving time elapses after the image forming apparatus 1000 is driven, the controller 200 may maintain the voltage compensation value for the control voltage without any more updating.

Figure 9:
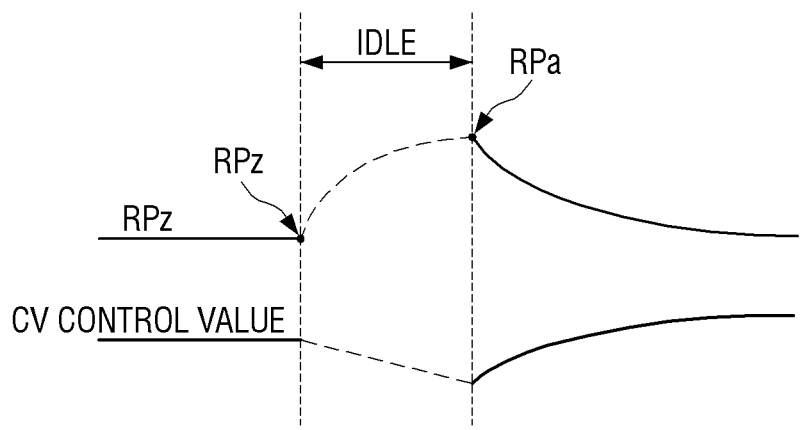
FIG. 9 is a graph illustrating a change in a parameter value and a control voltage which changes according to the parameter value.

FIG. 9 is a graph showing a change in an RP value and a control voltage which changes according to the parameter value.

Referring to FIG. 9, if the image forming apparatus 1000 is used, a RP value is constantly maintained. If the image forming apparatus 1000 is stopped, the controller 200 stores a last RP value that is used, which is an RPz value, in the second storage unit 340. Also, the controller 200 stores time information at which the RP value is lastly calculated in the second storage unit 340.

After that, if the image forming apparatus 100 is re-started after it is paused for a predetermined time, an RP value at that time, that is, an RPa value, is calculated. Specifically, the controller 200 confirms a pause time until the time at which the developing unit is started. The controller 200 calculates an initial parameter value RPa using the lastly stored RPz value and the pause time. The RPa value may be calculated using equation 1. The controller 200 calculates a current parameter value RPz' using equation 2 described above. The controller 200 determines a voltage compensation value using the calculated values and determines a control voltage using the voltage compensation value. Referring to FIG. 9, as the RPa is measured high, the control voltage is determined to be low at the initial stage. Accordingly, an appropriate control voltage is supplied to the toner sensor so that a sensing value corresponding to an actual toner concentration is output. Accordingly, an amount of toner is appropriately maintained.

The controller 200 stores the calculated RPz' value and time information at which the RPz' is calculated in the second storage unit 340, and starts to count the number of revolutions of the developing roller of the developing unit 100.

The controller 200 calculates the current RP value, that is, the RPz', using the number of revolutions of the developing unit at predetermined intervals, while the image forming apparatus 1000 is used. The controller 200 adjusts the control voltage according to the RPz' value periodically calculated. The period of adjusting the control voltage may be determined variously according to a characteristic or an environment of the image forming apparatus 1000. For instance, the RP value may be newly calculated every time that the developing roller is rotated 100 times and the control voltage may be adjusted.

Accordingly, as shown in FIG. 9, the control voltage is set to be lower at the initial stage, gradually increases, and is maintained after a predetermined time. That is, the control voltage may be maintained when the quantity of electric charge is stable. For instance, if the pause time is longer than 2 hours or if the driving time is longer than a time required to rotate the developing roller 600 times, the lastly determined control voltage may be maintained.

The controller 200 stores the calculated RP value and information on the time at which the RP value is calculated in the second storage unit 340. Also, when the job is finished, the controller 200 stores the RP value lastly calculated and information on the time at which the RP value is calculated. Accordingly, even if a job is not used for more than a predetermined time and thus the quantity of electric charge does not converge on the second saturation point, the control voltage can be appropriately determined next time considering the final RP value and the pause time.

As described above, the compensation value which is obtained considering additional factors such as temperature or humidity, a lifespan of the image forming apparatus, and a job processing speed is used along with the voltage compensation value, so that the control voltage can be more precisely determined.

Although the controller 200 calculates the RP value on a real time basis and calculates the level of the control voltage in the above exemplary embodiments, the level of the control voltage may be calculated in advance and may be stored in a form of a database according to another exemplary embodiment. For instance, the manufacturer of the image forming apparatus 1000 determines various conditions by combining various factors such as an quantity of electric charge, a pause time, a use time, temperature, humidity, a lifespan, and a job processing speed, and may calculate a level of a control voltage in advance using the above-mentioned equations according to each condition. The calculated control voltage is matched with each condition and may be created as a single database. If a created database is stored in the second storage unit 340 or the first storage unit 120, the controller 200 reads out an appropriate control voltage from the database, provides the read-out control voltage to the toner sensor, and adjusts an amount of toner to be supplied according to a sensing value of the toner sensor.

Figure 10:
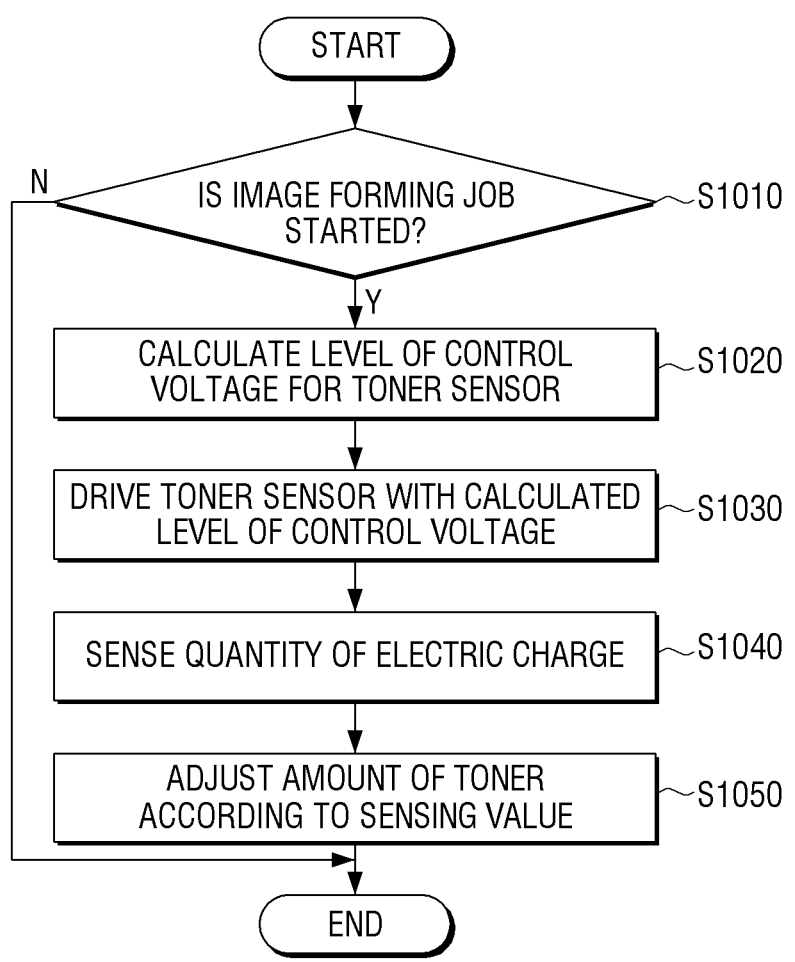
FIG. 10 is a flowchart illustrating a method of controlling a developing unit according to an exemplary embodiment.

FIG. 10 is a flowchart illustrating a method of controlling a developing unit according to an exemplary embodiment. Referring to FIG. 10, if an image forming job is started and the image forming apparatus 1000 is used (S1010), a level of a control voltage for the toner sensor is calculated (S1020). The level of the control voltage may be calculated based on information on a change in a quantity of electric charge or information on a pause time and a use time of the image forming apparatus.

The image forming apparatus drives the toner sensor using the calculated control voltage (S1030). Accordingly, if a quantity of electric charge is identified by a sensing value of the toner sensor (S1040), an amount of toner to be supplied to the developing unit 100 is adjusted according to the quantity of electric charge (S1050).

Figure 11:
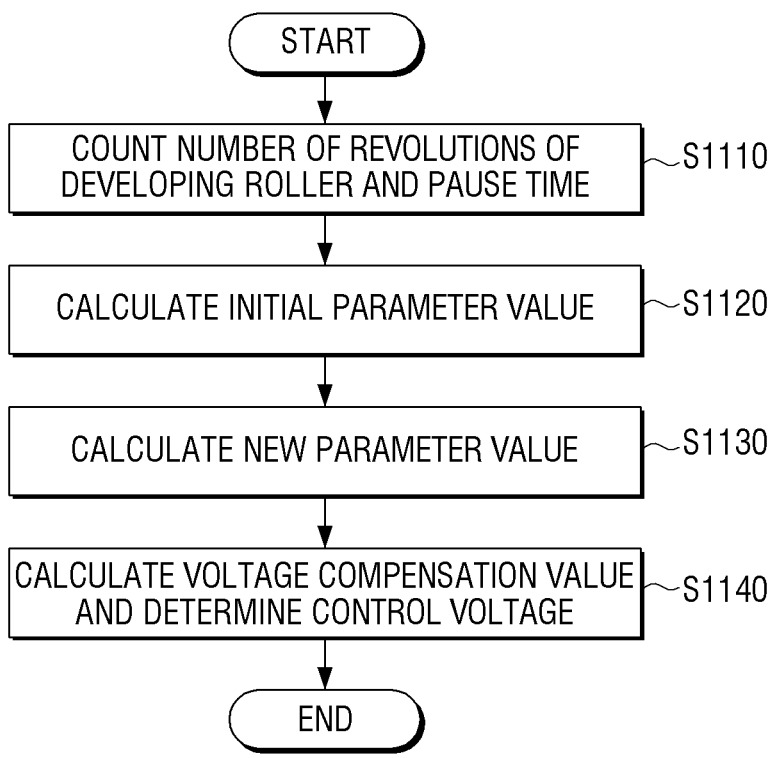
FIG. 11 is a flowchart illustrating a method of calculating a voltage compensation value according to an exemplary embodiment.

FIG. 11 is a flowchart illustrating a method of calculating a level of a control voltage. Referring to FIG. 11, the number of revolutions of the developing roller and a pause time are counted (S1110) and an initial parameter value (e.g., RPa) is calculated using the counted values (S1120). The initial parameter value may be calculated using an operation expression such as equation 1 described above. Variables necessary for calculating the initial parameter value may be stored in advance.

The image forming apparatus calculates a new parameter value (e.g., RPz') using the initial parameter value (S1130). The new parameter value may be calculated using an operation expression such as equation 2 described above.

If the new parameter value is calculated, the image forming apparatus calculates a voltage compensation value (e.g., RPCV) using the new parameter value (S1140), and determines a level of a control voltage (e.g., CV) using the voltage compensation value. Specifically, the voltage compensation value and the control voltage may be calculated using equations 3 and 4 described above, respectively.

Although not shown in FIGS. 10 and 11, the method of controlling the developing unit according to another exemplary embodiment may further include sensing at least one of temperature and humidity of the image forming apparatus.

The level of the control voltage may be compensated and calculated by adding an environment compensation value corresponding to at least one of sensed temperature and humidity, a lifespan compensation value corresponding to lifespan information of the developing unit, and a speed compensation value corresponding to a job processing speed of the image forming apparatus to the initial control voltage along with the voltage compensation value.

As described above, the control voltage may be updated at predetermined time intervals. If the image forming apparatus is used or paused for more than a predetermined time, the control voltage is not updated anymore and may be maintained. This has been described above and thus an overlapped explanation is omitted.

As described above, the image forming apparatus according to the various exemplary embodiments may control the toner sensor to output a sensing value corresponding to an actual toner concentration, considering a characteristic of a quantity of electric charge which changes according to a use time or a pause time of the image forming apparatus. Accordingly, the amount of toner to be supplied can be appropriately controlled without performing again to recover the quantity of electric charge and thus an image concentration can be prevented from being changed. As a result, toner scattering, image background, and a non-uniform image concentration can be prevented without increasing a warm-up time.

The various exemplary embodiments of the method of controlling the developing unit may be realized by executing a program stored in a non-transitory computer readable medium which is mounted in the image forming apparatus including the developing unit containing a mixture of toners and carriers and the toner sensor which is disposed in the developing unit.

That is, the non-transitory computer readable medium which stores a program to perform in sequence the operations of: calculating the level of the control voltage for the toner sensor using the information on the change in the quantity of electric charge which changes according to the use or pause time of the image forming apparatus, providing the calculated level of the control voltage to the toner sensor and driving the toner sensor, and, if the toner sensor is driven by the control voltage and senses a quantity of electric charge per unit mass of the developing agent in which toners and carriers are mixed, adjusting an amount of toner to be supplied to the developing unit based on an output value of the toner sensor, may be mounted in the image forming apparatus or connected to the image forming apparatus.

The non-transitory computer readable medium refers to a medium that stores data semi-permanently and is readable by an apparatus, rather than a medium that stores data for a very short time such as a register, a cache, and a memory. Specifically, the above-described various applications or programs may be stored in the non-transitory computer readable medium such as a CD, a DVD, a hard disk, a blue-ray disk, a USB, a memory card, and a ROM, and may be provided.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. An image forming apparatus comprising:
a developing unit which contains a mixture of toner and carrier;
a toner sensor which is disposed in the developing unit; and
a controller which determines a control voltage for the toner sensor using change information on a change in a quantity of electric charge which changes according to a time during which the image forming apparatus is used or paused, and drives the toner sensor using the determined control voltage to compensate an output value of the toner sensor.

2. The image forming apparatus as claimed in claim 1, wherein the toner sensor is driven according to the control voltage and measures a quantity of electric charge per unit mass of a developing agent of the developing unit, in which toner and carrier are mixed, and
wherein the controller adjusts an amount of toner to be supplied to the developing unit based on an output value of the toner sensor.

3. The image forming apparatus as claimed in claim 2, further comprising:
a counter unit which counts a number of revolutions of a developing roller of the developing unit and a pause time of the image forming apparatus;
a first storage unit which stores information on an initial control voltage which is matched with each quantity of electric charge; and
a second storage unit which stores the change information, wherein the controller calculates a voltage compensation value using the number of revolutions, the pause time, and the change information, detects an initial control voltage matched with an initial quantity of electric charge sensed by the toner sensor from the first storage unit, and calculates the control voltage by adding the voltage compensation value to the detected initial control voltage.

4. The image forming apparatus as claimed in claim 3, wherein the change information comprises a parameter value which is obtained by normalizing an output value of the toner sensor which changes with time within a predetermine range,
wherein the controller calculates an initial parameter value at a time when the image forming apparatus is driven using a parameter value lastly stored in the second storage unit from among the parameter values, and
wherein the controller calculates a new parameter value at a time when the image forming apparatus is driven using the initial parameter value and calculates the voltage compensation value based on the calculated new parameter value.

5. The image forming apparatus as claimed in claim 4, wherein the controller calculates the initial parameter value RPa using equation 1, $RPa=RPmax(RPmax-RPz)*exp(-Mn/256)$, calculates the new parameter value RPz' using equation 2, $RPz'=RPa*exp(Rv/256)$, and calculates the voltage compensation value RPCV using equation 3, $RPCV=(RPz'/K)$, and
wherein in the equations 1, 2, and 3, RPz is a parameter value which is lastly calculated and stored, RPmax is a maximum value from among pre-calculated parameter values, Mn is a pause time during which the image forming apparatus is paused, Rv is a number of revolutions of the developing roller, and K is a predetermined factor to determine an amount of correction.

6. The image forming apparatus as claimed in claim 5, further comprising a sensor unit which senses at least one of temperature and humidity of the image forming apparatus,
wherein the second storage unit stores lifespan information of the developing unit, and
wherein the controller calculates the control voltage by adding an environment compensation value corresponding to a sensing result of the sensor unit, a lifespan compensation value corresponding to the lifespan information, and a speed compensation value corresponding to a job processing speed of the image forming apparatus to the initial control voltage along with the voltage compensation value.

7. The image forming apparatus as claimed in claim 1, wherein the controller calculates the control voltage and updates the control voltage at predetermined time intervals.

8. The image forming apparatus as claimed in claim 7, wherein, if a predetermined pause time elapses in a state where an operation of the image forming apparatus is stopped or if a predetermined driving time elapses after driving of the image forming apparatus is started, the controller maintains the voltage compensation value for the control voltage.

9. A method of controlling a developing unit of an image forming apparatus which comprises a developing unit which contains a mixture of toner and carrier, and a toner sensor which is disposed in the developing unit, the method comprising:
if an image forming job is started, calculating a level of a control voltage for the toner sensor using change information on a change in a quantity of electric charge which changes according to a use or pause time of the image forming apparatus;
providing the calculated level of the control voltage to the toner sensor and driving the toner sensor; and
if the toner sensor is driven by the control voltage and senses a quantity of electric charge per unit mass of a developing agent in which toner and carrier are mixed, adjusting an amount of toner to be supplied to the developing unit based on an output value of the toner sensor.

10. The method as claimed in claim 9, wherein the calculating of the level of the control voltage comprises:
counting a number of revolutions of a developing roller of the developing unit and a pause time of the image forming apparatus;
calculating a voltage compensation value using the number of revolutions, the pause time, and the change information; and
adding the voltage compensation value to an initial control voltage which is matched with an initial quantity of electric charge sensed by the toner sensor and determining a result value of the adding as the level of the control voltage.

11. The method as claimed in claim 10, wherein the change information comprises a parameter value which is obtained by normalizing an output value of the toner sensor which changes with time within a predetermine range, and
wherein the calculating of the voltage compensation value comprises:
calculating an initial parameter value at a time when the image forming apparatus is driven using a parameter value lastly calculated and stored from among the parameter values;
calculating a new parameter value at a time when the image forming apparatus is driven using the initial parameter value; and
calculating the voltage compensation value based on the calculated new parameter value.

12. The method as claimed in claim 11, wherein the initial parameter value is calculated using equation 1, $RPa=RPmax(RPmax-RPz)*exp(-Mn/256)$, the new parameter value is calculated using equation 2, $RPz'=RPa*exp(Rv/256)$, and the voltage compensation value is calculated using equation 3, $RPCV=(RPz'/K)$,
wherein in the equations 1, 2, and 3, RPa is the initial parameter value, the RPz' is the new parameter value, RPCV is the voltage compensation value, RPz is a parameter value which is lastly calculated and stored, RPmax is a maximum value from among the pre-calculated parameter values, Mn is a pause time during which the image forming apparatus is paused, Rv is a number of revolutions of the developing roller, and K is a predetermined factor to determine an amount of correction.

13. The method as claimed in claim 12, further comprising sensing at least one of temperature and humidity of the image forming apparatus,
wherein the calculating of the level of the control voltage comprises calculating the level of the control voltage by adding an environment compensation value corresponding to at least one of the sensed temperature and the humidity, a lifespan compensation value corresponding to lifespan information of the developing unit, and a speed compensation value corresponding to a job processing speed of the image forming apparatus to the initial control voltage along with the voltage compensation value.

14. The method as claimed in claim 9, further comprising updating the control voltage at predetermined time intervals.

15. The method as claimed in claim 14, wherein, if a predetermined pause time elapses in a state where an operation of the image forming apparatus is stopped or if a predetermined driving time elapses after driving of the image forming apparatus is started, the voltage compensation value for the control voltage is maintained.

16. An image forming apparatus comprising:
a developing unit that contains a developing agent including toner and carrier;
a toner sensor to measure a quantity of electric charge of the developing agent and to output an output value; and
a controller to compensate the output value of the toner sensor based on a change in the quantity of electric charge, the change occurring according to driving or pausing of the image forming apparatus, and to control an amount of toner to be supplied to the developing unit according to the compensated output value.

17. The image forming apparatus as claimed in claim 16, wherein the controller determines a control voltage for the toner sensor to compensate the output value of the toner sensor according to the change in the quantity of electric charge.

18. The image forming apparatus as claimed in claim 17, wherein the change in the quantity of electric charge during the driving of the image forming apparatus is an increase in the quantity of electric charge, and
wherein the controller compensates the output value of the toner sensor by applying the control voltage that is decreased to adjust for the increase in the quantity of electric charge.

19. The image forming apparatus as claimed in claim 17, wherein the change in the quantity of electric charge during the pausing of the image forming apparatus is a decrease in the quantity of electric charge, and
wherein the controller compensates the output value of the toner sensor by applying the control voltage that is increased to adjust for the decrease in the quantity of electric charge.

20. The image forming apparatus as claimed in claim 16, wherein the output of the toner sensor is further compensated according to at least one of a sensing result of a sensor unit, lifespan information of the developing unit, and a job processing speed of the image forming apparatus.

* * * * *

UNITED STATES PATENT AND TRADEMARK OFFICE
CERTIFICATE OF CORRECTION

PATENT NO. : 8,886,063 B2
APPLICATION NO. : 13/673322
DATED : November 11, 2014
INVENTOR(S) : Byung-kyu Kim et al.

Page 1 of 1

It is certified that error appears in the above-identified patent and that said Letters Patent is hereby corrected as shown below:

On the Title Page

Column 1, Item [71] (Applicants), delete "Byung-kyu, Bucheon-si (KR); Hae-chul Han, Suwon si (KR); Shinichi Hisatomi, Suwon-si (KR)" and insert -- Samsung Electronics Co., Ltd., Suwon-si (KR) --

Signed and Sealed this
Eighteenth Day of August, 2015

Michelle K. Lee
*Director of the United States Patent and Trademark Office*